(12) United States Patent
Kwon et al.

(10) Patent No.: US 9,006,030 B1
(45) Date of Patent: Apr. 14, 2015

(54) WARPAGE MANAGEMENT FOR FAN-OUT MOLD PACKAGED INTEGRATED CIRCUIT

(71) Applicant: Xilinx, Inc., San Jose, CA (US)

(72) Inventors: Woon-Seong Kwon, Cupertino, CA (US); Suresh Ramalingam, Fremont, CA (US); Paul Y. Wu, Saratoga, CA (US); Manoj Nachnani, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/100,678

(22) Filed: Dec. 9, 2013

(51) Int. Cl.
*H01L 23/492* (2006.01)
*H01L 21/58* (2006.01)
*H01L 23/00* (2006.01)
*H01L 23/498* (2006.01)

(52) U.S. Cl.
CPC ........ *H01L 23/562* (2013.01); *H01L 23/49811* (2013.01)

(58) Field of Classification Search
CPC ............ H01L 2224/3224; H01L 24/94; H01L 23/49827; H01L 2924/3511; H01L 24/83; H01L 21/486

USPC .................................................. 438/108, 126
See application file for complete search history.

(56) References Cited

U.S. PATENT DOCUMENTS

| 6,841,026 | B2 * | 1/2005 | Blumberg et al. ............. 156/285 |
| 7,763,965 | B2 * | 7/2010 | Webb ............................. 257/687 |
| 8,624,372 | B2 * | 1/2014 | Hetzel et al. .................. 257/686 |
| 2005/0272183 | A1 * | 12/2005 | Lukacs et al. ................. 438/109 |
| 2007/0020908 | A1 * | 1/2007 | Honer et al. ................... 438/612 |
| 2009/0134494 | A1 * | 5/2009 | Funakoshi ..................... 257/620 |
| 2009/0186446 | A1 * | 7/2009 | Kwon et al. ................... 438/107 |
| 2013/0271929 | A1 * | 10/2013 | Malatkar et al. .............. 361/748 |
| 2014/0103516 | A1 * | 4/2014 | Yeom ............................. 257/685 |
| 2014/0210106 | A1 * | 7/2014 | Zhai ............................... 257/777 |

* cited by examiner

*Primary Examiner* — George Fourson, III
(74) *Attorney, Agent, or Firm* — Kevin T. Cuenot; Keith Taboada

(57) ABSTRACT

An integrated circuit includes a stacked conductive layer interposer and a first die at least partially encapsulated in a mold material. The first die is mechanically and electrically attached to a top surface of the stacked conductive layer interposer using solder bumps. The integrated circuit further includes a first warpage correction layer.

16 Claims, 3 Drawing Sheets

WARPAGE MANAGEMENT FOR FAN-OUT MOLD PACKAGED INTEGRATED CIRCUIT

FIELD OF THE INVENTION

This disclosure relates to integrated circuits (ICs) and, more particularly, to warpage management for fan-out mold packaged ICs.

BACKGROUND

Fan-out mold packaging is an IC packaging technology that seeks to provide an increased number of external contacts for the IC compared to other packaging technologies. Fan-out mold packaging attaches a die to an interposer structure. The interposer structure has a larger area than the die attached thereto. The die is encapsulated by mold material that fills space above the interposer structure that otherwise would be unoccupied by the die. The increased area of the interposer structure allows more external contacts to be included than would be the case were the IC implemented using only the die without the interposer structure. The increased number of external contacts is obtained without having to increase the size of the die. Increasing die size tends to be more expensive than using the interposer structure and the added mold material.

As briefly noted, more than one die may be encapsulated in the mold material and attached to the interposer structure. In the case of a multi-die IC, The dies are spaced apart within the mold encapsulation. The spacing between the dies allows for an interposer structure of greater area to be attached to the dies, thereby providing additional space for the inclusion additional external contacts for the IC.

During manufacture and testing, ICs implemented using fan-out mold packaging technology are subjected to high levels of stress. The stress may induce warpage in the IC that may result in defects. For example, warpage may cause breakage in the metal interconnects of the interposer structure.

SUMMARY

An integrated circuit (IC) includes a stacked conductive layer interposer and a first die at least partially encapsulated in a mold material. The first die is mechanically and electrically attached to a top surface of the stacked conductive layer interposer using solder bumps. The IC includes a first warpage correction layer.

In one aspect, the first warpage correction layer is formed on a bottom surface of the stacked conductive layer interposer. In that case, the first warpage correction layer can be formed of a non-conductive material. In another aspect, the first warpage correction layer is formed on a top surface of the IC. In that case, the top surface of the IC is formed of a top surface of the first die and the mold material. Further, the first warpage correction layer can be formed of a conductive material or a non-conductive material.

The IC can include a second die at least partially encapsulated in the mold material. The second die is mechanically and electrically attached to the top surface of the stacked conductive layer interposer using solder bumps. In a further aspect, the first warpage correction layer is formed on a top surface of the IC wherein the top surface of the first die, a top surface of the second die, and the mold material form the top surface of the IC.

The IC also can include a second warpage correction layer. In one aspect, the first warpage correction layer is formed on a bottom surface of the stacked conductive layer interposer. The second warpage correction layer is formed on a top surface of the IC. In that case, the top surface of the IC is formed of a top surface of the first die and the mold material.

A method of manufacturing an IC includes providing a stacked conductive layer interposer and a first die at least partially encapsulated in a mold material. The first die is mechanically and electrically attached to a top surface of the stacked conductive layer interposer using solder bumps. The method further includes applying a first warpage correction layer.

In one aspect, applying the first warpage correction layer includes forming the first warpage correction layer on a bottom surface of the stacked conductive layer interposer. In that case, the first warpage correction layer can be formed of a non-conductive material. In another aspect, applying the first warpage correction layer includes forming the first warpage correction layer on a top surface of the IC. In that case, the top surface of the IC is formed by a top surface of the first die and the mold material. Accordingly, the first warpage correction layer can be formed of a conductive material or a non-conductive material.

The method also can include providing a second die at least partially encapsulated in the mold material and mechanically and electrically attached to the top surface of the stacked conductive layer interposer using solder bumps. In a further aspect, applying the first warpage correction layer includes forming the first warpage correction layer on a top surface of the IC, wherein the top surface of the IC is formed of the first die, the second die, and the mold material.

The method further can include applying a second warpage correction layer. Applying the first warpage correction layer can include forming the first warpage correction layer on a bottom of the stacked conductive layer interposer. Applying the second warpage correction layer can include forming the second warpage correction layer on a top surface of the IC. In that case, the top surface of the IC is formed of a top surface of the first die and the mold material.

DETAILED DESCRIPTION OF THE DRAWINGS

While the disclosure concludes with claims defining novel features, it is believed that the various features described herein will be better understood from a consideration of the description in conjunction with the drawings. The process (es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure.

Further, the terms and phrases used within this disclosure are not intended to be limiting, but rather to provide an understandable description of the features described.

This disclosure relates to integrated circuits (ICs) and, more particularly, to warpage management for fan-out mold packaged ICs. In accordance with the inventive arrangements disclosed herein, warpage of an IC implemented using fan-out mold packaging may be controlled and/or managed by applying one or more additional IC process layers referred to as warpage correction layers. A warpage correction layer may be added to a top surface of the IC, to a bottom surface of a stacked conductive layer interposer of the IC, or to both the top surface of the IC and the bottom surface of the stacked conductive layer interposer.

Typically, a fan-out packaged IC suffers from warpage in which the edges of the stacked conductive layer interposer warp or flare upward as a smile or a U-shape. Advantageously, this warpage may be countered or corrected by application or formation of one or more waprage correction layers. The warpage correction layers apply a downward force to the edges of the IC that counters the warpage. The amount of corrective force applied by the IC by the warpage correction layer(s) varies in accordance with the type of material used for the warpage correction layer(s), the location of the warpage correction layer(s), and the thickness of the warpage correction layer(s).

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
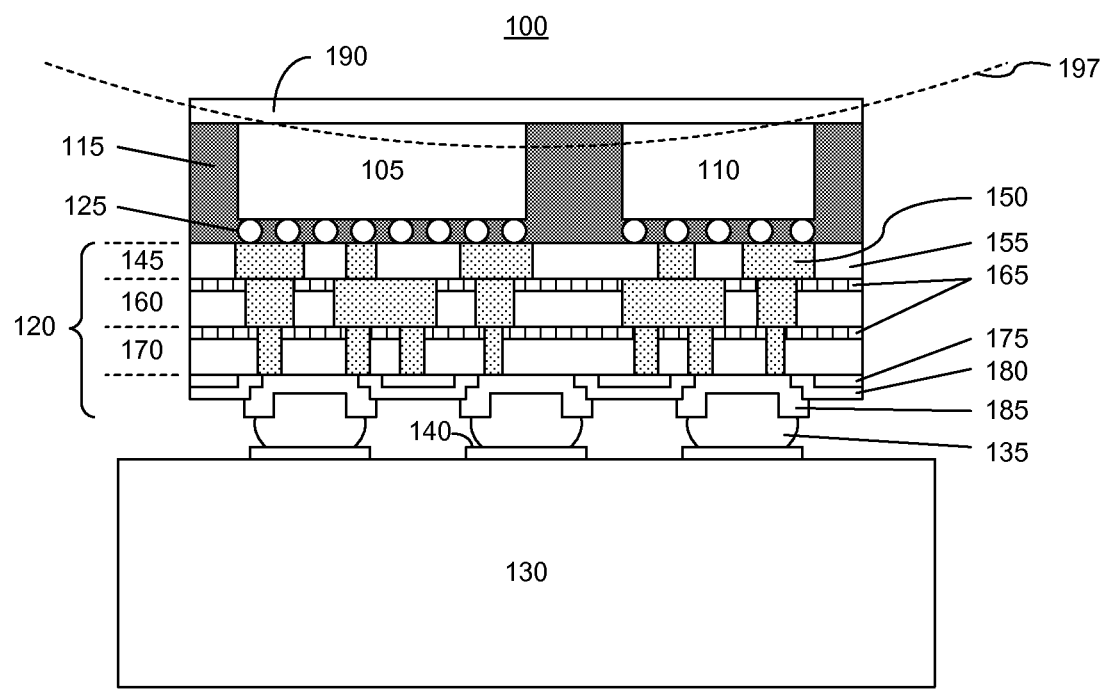
FIG. 1 is a block diagram illustrating a cross-sectional side view of an exemplary integrated circuit (IC).

FIG. 1 is a block diagram illustrating a cross-sectional side view of an exemplary IC 100. IC 100 is implemented using fan-out mold packaging. In the example of FIG. 1, IC 100 is implemented using multiple dies. It should be appreciated, however, that the various arrangements described within this disclosure may be implemented using a single die, two dies, or more than two dies using fan-out mold packaging. The number of dies shown is not intended as a limitation.

IC 100 includes dies 105 and 110 embedded, or encapsulated, within mold material 115. Each of dies 105 and 110 is at least partially encompassed or encapsulated by mold material 115. As pictured, each of dies 105 and 110 is surrounded by mold material on each side with the exception of a top surface of each die of dies 105 and 110. The top surface of die 105, die 110, and mold material 115 form a top surface of IC 100 prior to application of warpage correction layer 190.

Dies 105 and 110 are mechanically and electrically attached to an interposer 120 using a plurality of solder bumps 125. In one aspect, solder bumps 125 are implemented as micro-bumps. Application of mold material 115 also helps to mechanically attach dies 105 and 110 to interposer 120. Interposer 120 is implemented as a stacked conductive layer interposer. As defined within this disclosure, the term "interposer" means a stacked conductive layer interposer. A stacked conductive layer interposer is a wire and/or interconnects structure having a plurality of stacked, patterned conductive layers. A stacked conductive layer interposer includes no silicon substrate portion between the bottom or lowest patterned conductive layer and the solder bumps that attach the stacked conductive layer interposer to a package substrate. In this regard, no through vias or through silicon vias are required to connect signals from die 105 and/or die 110 to a package substrate.

Interposer 120 is mechanically and electrically attached to a package substrate 130 through a plurality of solder bumps 135. In one aspect, solder bumps 135 are implemented as controlled collapse chip connection (C4) balls. In one aspect, package substrate 130 is implemented using any of a variety of known organic materials. Pads 140 are formed on a top surface of package substrate 130. Pads 140 are formed of a conductive material such as metal. Accordingly, solder bumps 135 contact pads 140, thereby electrically and mechanically attaching interposer 120 to substrate package 130.

Interposer 120 includes a plurality of alternating conductive and insulating layers. A patterned conductive layer 145 is formed to include a conductive material 150 shown with shading that implements a plurality of wires and/or vias. Conductive material 150 may be aluminum, gold, copper, nickel, various silicides, and/or the like. Portions of patterned conductive layer 145 that are unoccupied by conductive material 150, e.g., those portions of conductive material 150 that were removed, are occupied or filled by insulating material 155.

Interposer 120 includes a next patterned conductive layer 160. Patterned conductive layer 160 includes conductive material 150 forming one or more wires and/or vias. Portions of patterned conductive layer 160 that have been removed are occupied or filled by insulating material 155. As illustrated, above each of the portions of insulating material 155 within patterned conductive layer 160 is a further layer 165. Layer 165 can be an oxide layer forming an interlayer dielectric (ILD) layer or an inter-metal dielectric (IMD) layer.

Interposer 120 includes a next patterned conductive layer 170. Patterned conductive layer 170 includes conductive material 150 forming one or more wires and/or vias. Portions of patterned conductive layer 170 that have been removed are occupied or filled by insulating material 155. As illustrated, above each of the portions of insulating material 155 within patterned conductive layer 170 is a layer 165. Layer 165 can be an oxide layer forming an ILD layer or an IMD layer. As pictured, no silicon substrate exists as part of interposer 120 between patterned conductive layer 170 and solder bumps 135.

Layer 175 is a passivation layer formed as part of interposer 120. Layer 175 is patterned to accommodate solder bumps 135. For example, layer 175 is patterned using a contact dielectric etch process to remove material. In one aspect, layer 175 is implemented as an oxide such as undoped silicon glass (USG) or thermal oxide (Tox). Layer 180 is a passivation layer formed as part of interposer 120. Layer 180 is patterned to accommodate solder bumps 135. In one aspect, layer 180 is implemented as an organic polyimide passivation layer. Under bump metallization (UBM) 185 is then added to interposer 120 to which solder bumps 135 are attached.

Warpage within interposer 120 can occur for a variety of reasons. In one aspect, warpage may occur during a reflow process used to attach interposer 120 to package substrate 130. In another aspect, the mold encapsulation process may cause warpage of interposer 120. The curing of mold material 115, for example, tends to shrink more than other materials of interposer 120 and/or dies 105 and 110. In a further aspect, UBM 185 may induce a high amount of stress that can contribute to warpage and, as such, cracking in patterned conductive layers 145, 160, and/or 170 of interposer 120. Warpage occurs, in large part, due to the varying thermal coefficients of the different materials used to form IC 100 and the heating that occurs as part of IC manufacture and/or testing. In general, warpage with respect to interposer 120 occurs in the direction of warpage line 197. As discussed and illustrated by warpage line 197, warpage refers to an upward flaring of the edges of interposer 120 causing interposer 120 to take on a smile shape or a U-shape.

Advantageously, a warpage correction layer 190 is applied to the top surface of IC 100. Warpage correction layer 190 applies a compressive force to IC 100 that counters warpage. Warpage correction layer 190 can be applied at any of a variety of stages once dies 105 and 110 are attached to interposer 120 and encapsulated, at least partially, with mold material 115 as pictured.

In one aspect, warpage correction layer 190 is implemented as a conductive layer such as a metal film layer, an organic film, an inorganic film, or a silicon dummy chip. Exemplary materials used to form warpage correction layer 190 when implemented as a conductive layer, e.g., a metal film, include, but are not limited to, titanium, gold, tungsten, silicon, and the like. Exemplary materials used to form warpage correction layer 190 when implemented as an organic coating or film include, but are not limited to, polybenzoxazole, polyimide, polyamide, benzocyclobutene, and the like.

For purposes of clarity and illustration, a general description of the manufacture of an interposer and the attachment of dies thereto, as described with reference to FIG. 1, follows. Formation of interposer 120 can begin with a P-wafer having a silicon substrate upon which passivation layer 175 is formed. The silicon substrate beneath passivation layer 175 is not illustrated as the silicon substrate material is later removed. Above passivation layer 175, patterned conductive layers 170, 160, and 145 are formed substantially as described with reference to FIG. 1. Back end of line (BEOL) processes may be used to form interposer 120, which also may be referred to as a metal stack-up.

Dies 105 and 110 are attached to the top surface of patterned conductive layer 145 using solder bumps 125. A mold encapsulation process is performed which adds mold material 115 to at least partially encapsulate dies 105 and 110. A mechanical grinding and/or polishing process is performed that thins the silicon substrate beneath passivation layer 175. The remainder of the silicon substrate is removed from beneath passivation layer 175 using a selective silicon etch process. The exposed passivation layer 175 is treated for further processing. With passivation layer 175 exposed, a further etch process is performed on passivation layer 175 to create spaces for solder bumps 135.

Passivation layer 180 is applied to passivation layer 175. Next, UBM 185 is applied to the bottom of interposer 120 where solder bumps 135 will be formed. Having applied UBM 185, solder bumps 135 are formed. The wafer further may be diced. Interposer 120 may also be attached to package substrate 130.

As discussed, warpage correction layer 190 may be applied at any of a variety of different points during the previously described process. For example, warpage correction layer 190 may be applied any time after mold encapsulation of dies 105 and 110. The particular material used to form warpage correction layer 190 and the thickness of warpage correction layer 190 may be selected to counter warpage effects from stress applied to interposer 120. A thicker warpage correction layer 190 will counter or correct for a larger amount of warpage than will thinner warpage correction layer 190.

Figure 2:
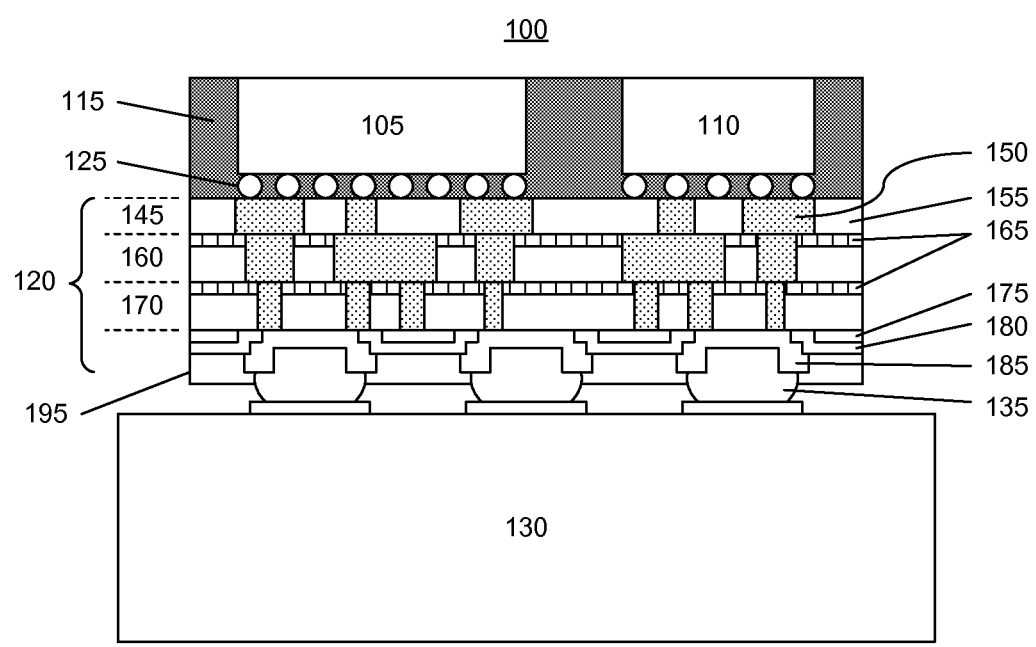
FIG. 2 is a block diagram illustrating a cross-sectional side view of the IC of FIG. 1 according to another aspect.

FIG. 2 is a block diagram illustrating a cross-sectional side view of IC 100 according to another aspect. IC 100 is implemented substantially as described with reference to FIG. 1. Instead of including warpage correction layer 190 on a top surface of IC 100, a warpage correction layer 195 is formed on a bottom surface of interposer 120. As shown, warpage correction layer 195 is formed on a bottom surface of interposer 120. For example, warpage correction layer 195 is formed over passivation layer 185. Further, solder bumps 135 are exposed through warpage correction layer 195 in order to attach interposer 120 to package substrate 130.

Warpage correction layer 195 is formed as a non-conductive layer. For example, warpage correction layer 195 can be implemented as an organic coating using any of the various exemplary materials previously described. In any case, warpage correction layer 195 may be applied to the bottom surface of interposer 120 once UBM 185 is applied and prior to the formation of solder bumps 135. Warpage correction layer 195 may be patterned, e.g., etched, to create gaps for the formation of solder bumps 135.

Like warpage correction layer 190, warpage correction layer 195 applies a force to interposer 120 that is counter to warpage line 197. As such, warpage correction layer 195 applies a force that pulls edges of interposer 120 downward thereby countering warpage and resulting in a substantially flat or un-warped interposer 120.

Figure 3:
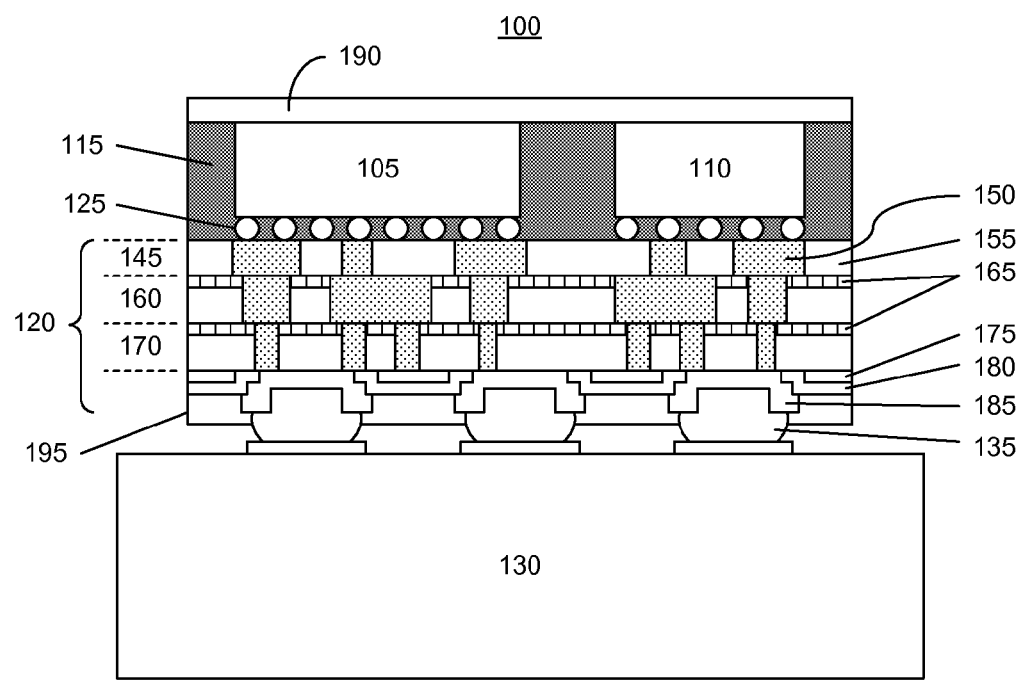
FIG. 3 is a block diagram illustrating a cross-sectional side view of the IC of FIG. 1 according to another aspect.

FIG. 3 is a block diagram illustrating a cross-sectional side view of IC 100 according to another aspect. IC 100 is implemented substantially as described with reference to FIGS. 1 and 2. In the example pictured in FIG. 3, however, both warpage correction layer 190 is applied to a top surface of IC 100 and warpage correction layer 195 is applied to a bottom surface of interposer 120. In the case of both warpage correction layer 190 and warpage correction layer 195, each may be implemented as previously described with reference to FIG. 1 and FIG. 2. The warpage counter effect resulting from use of two warpage correction layers as pictured in FIG. 3 is cumulative, thereby providing increased force compared to using only a single warpage correction layer to counter warpage.

Figure 4:
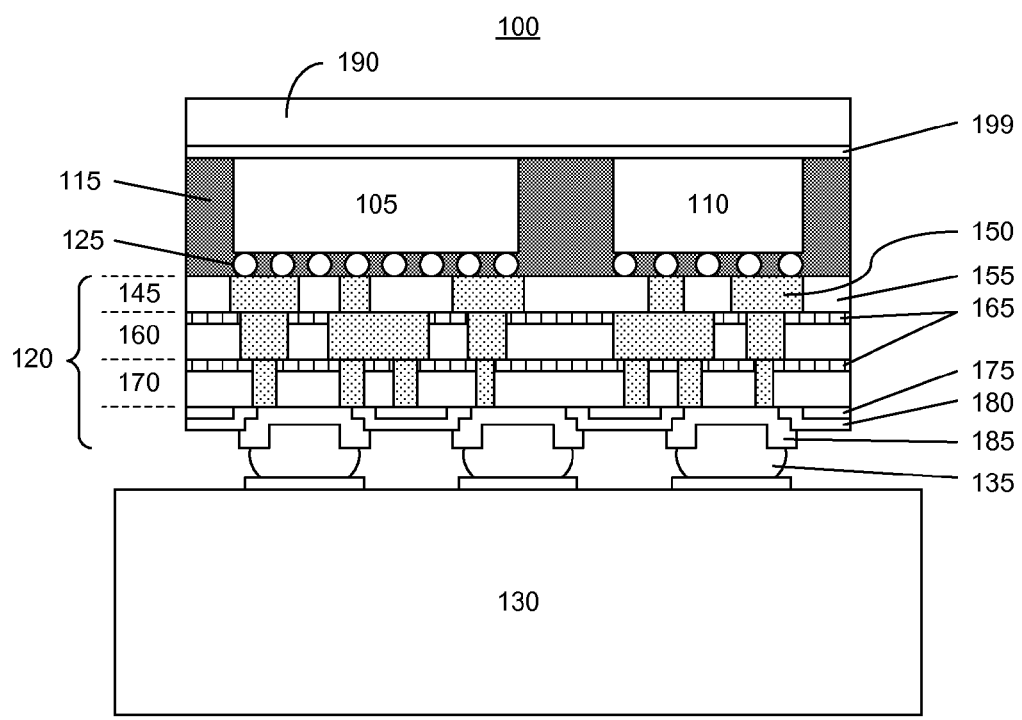
FIG. 4 is a block diagram illustrating a cross-sectional side view of the IC of FIG. 1 according to another aspect.

FIG. 4 is a block diagram illustrating a cross-sectional side view of IC 100 according to another aspect. IC 100 is implemented substantially as described with reference to FIG. 1. In the example of FIG. 4, warpage correction layer 190 is implemented as a portion or block of silicon wafer also known as a dummy silicon block that is attached to the top surface of IC 100 using a die attach adhesive 199. A "die attach adhesive" means a material that is used to stack and mechanically attach one IC structure such as a die or a dummy silicon block to another IC structure such as a different die and/or mold material. Examples of die attach adhesives include, but are not limited to, materials considered die attach films, dicing die attach films, die attach pastes, self-filleting die attach pastes, and the like. In one aspect, die attach adhesive 199 is non-conductive.

Figure 5:
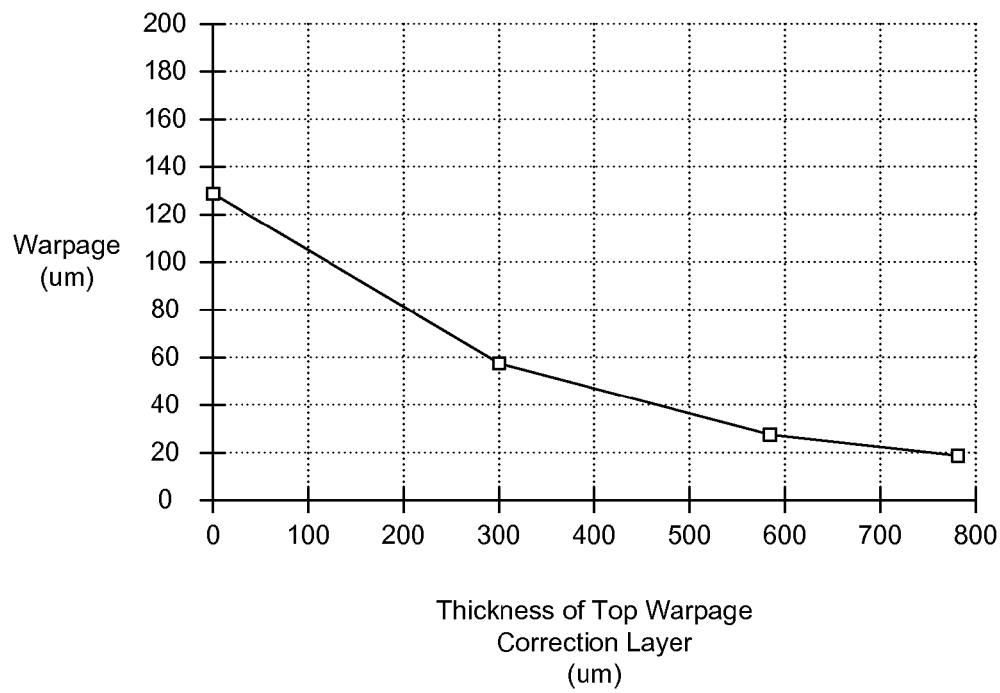
FIG. 5 is a graph illustrating warpage correction for an IC using a warpage correction layer.

FIG. 5 is a graph illustrating warpage correction for an IC using a warpage correction layer. FIG. 5 illustrates the reduction in warpage that can be achieved in an IC through the use of a warpage correction layer. The x-axis indicates thickness of the top warpage correction layer measured in μm. The y-axis indicates warpage of the IC as measured in μm. FIG. 5 illustrates warpage reduction in an IC configured as described with reference to FIG. 4. Thus, the warpage correction layer, e.g., warpage correction layer 190, is implemented as a silicon block attached to the top surface of IC 100 using a die attach adhesive, e.g., die attach adhesive 199.

FIG. 5 illustrates that with no top warpage correction layer, corresponding to a thickness of zero on the x-axis, warpage in the IC is approximately 130 μm. With a top warpage correction layer having a thickness of approximately 300 μm, warpage in the IC is reduced to approximately 58 μm. With a top warpage correction layer having a thickness of approximately 580 μm, warpage in the IC is reduced to approximately 28 μm. Finally, with a top warpage correction layer having a thickness of approximately 775 µm, waprage in the IC is further reduced to approximately 20 µm.

Figure 6:
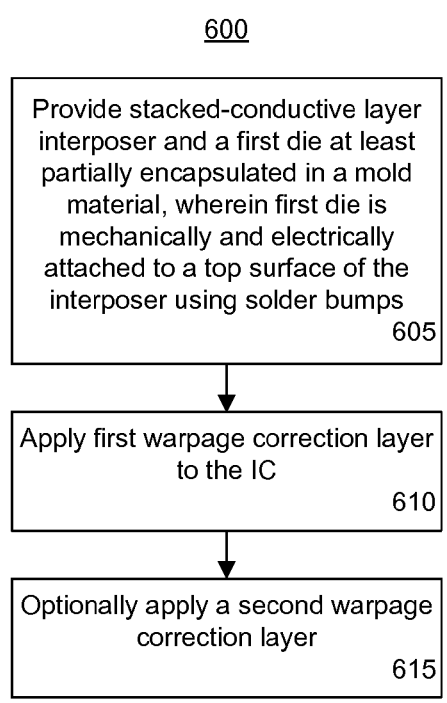
FIG. 6 is a flow chart illustrating an exemplary method of implementing an IC having a warpage correction layer.

FIG. 6 is a flow chart illustrating an exemplary method 600 of implementing an IC having one or more warpage correction layers. Method 600 can be implemented using any of a variety of IC manufacturing techniques and equipment known to the skilled artisan.

In block 605, an interposer is provided. The interposer is a stacked conductive layer interposer. Such a structure is also referred to as a "silicon-less" interposer. The interposer includes one or more dies partially encapsulated by mold material. The one or more dies are mechanically and electrically attached to a top surface of the interposer using solder bumps.

In block 610, a first warpage correction layer is applied to the IC. In one aspect, the first warpage correction layer is formed on a bottom surface of the interposer. In another aspect, the first warpage correction layer is formed on a top surface of the IC. The top surface of the IC is formed by a top surface of the first die and the mold material. In the case where the IC includes more than one die, the top surface is formed by the top surface of each die and the mold material. The first warpage correction layer may be implemented as a metal film layer or as an organic coating.

In block 615, a second warpage correction layer optionally is applied to the IC. In one aspect, the second warpage correction layer is applied to either the top surface of the IC or to the bottom surface of the interposer depending upon the location of the first warpage correction layer. For example, when the first warpage correction layer is applied to the top surface of the IC, the second warpage correction layer is applied to the bottom of the interposer. In another example, when the first warpage correction layer is applied to the bottom surface of the interposer, the second warpage correction layer is applied to the top surface of the IC. The second warpage correction layer may be implemented as a metal film or as an organic coating.

In one aspect, when both first and second warpage correction layers are used, both may be implemented as a metal film or both may be implemented as an organic coating. In another aspect, each warpage correction layer may be different. For example, the warpage correction layer applied to the top of the IC may be a metal film while the warpage correction layer applied to the bottom of the interposer may be an organic coating. In another example, the warpage correction layer applied to the top of the IC may be an organic coating, while the warpage correction layer applied to the bottom of the interposer is a metal film.

In applying the first and/or second warpage correction layers, the material used for each respective warpage correction layer and the thickness of such layer(s) can depend upon the amount of correction required. Thicker layers will provide more warpage correction than thinner warpage correction layers.

In accordance with the inventive arrangements described within this disclosure, warpage effects that typically occur for fan-out mold packaged ICs may be counteracted through the use of one or more warpage correction layers. The warpage correction layers may be applied to a top surface of the IC, to a bottom surface of an interposer of the IC, or to both. By using one or more warpage correction layers as described herein, defects within the IC such as cracked metal wires and/or interconnects within the interposer may be avoided. As discussed, the techniques described herein may be applied to fan-out mold packaged ICs having one die or a plurality of dies without limitation.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. An integrated circuit, comprising:
    a stacked conductive layer interposer having a top surface and a bottom surface, the bottom surface having portions of an under bump metalization (UBM) layer exposed through a passivation layer;
    a first die at least partially encapsulated in a mold material;
    wherein the first die is mechanically and electrically attached to the top surface of the stacked conductive layer interposer using solder bumps; and a first warpage correction layer formed over a portion the UBM layer.

2. An integrated circuit comprising:
a stacked conductive layer interposer;
a first die at least partially encapsulated in a mold material;
wherein the first die is mechanically and electrically attached to a top surface of the stacked conductive layer interposer using solder bumps; and
a first warpage correction layer formed from a metal layer, the first warpage correction layer formed on a top surface of the first die and the mold material, the warpage correction layer forming a top surface of the integrated circuit.

3. The integrated circuit of claim 2, further comprising:
a second die at least partially encapsulated in the mold material and mechanically and electrically attached to the top surface of the stacked conductive layer interposer using solder bumps.

4. The integrated circuit of claim 3, wherein:
the first warpage correction layer is formed on a top surface of the integrated circuit; and
a top surface of the first die, a top surface of the second die, and the mold material form the top surface of the integrated circuit.

5. The integrated circuit of claim 2, further comprising:
a second warpage correction layer.

6. The integrated circuit of claim 5, wherein:
the first second warpage correction layer is formed on a bottom surface of the stacked conductive layer interposer; and
the second warpage correction layer is formed on a top surface of the integrated circuit; and
the top surface of the integrated circuit is formed of a top surface of the first die and the mold material.

7. An integrated circuit, comprising:
a stacked conductive layer interposer;
a first die at least partially encapsulated in a mold material;
wherein the first die is mechanically and electrically attached to a top surface of the stacked conductive layer interposer using solder bumps; and
a first warpage correction layer, wherein the first warpage correction layer is formed on a top surface of the integrated circuit, wherein the top surface of the integrated circuit is formed of a top surface of the first die and the mold material, and wherein the first warpage correction layer is a non-conductive material.

8. The integrated circuit of claim 1, wherein the first warpage correction layer is a non-conductive material.

9. A method manufacturing an integrated circuit, comprising:
providing a stacked conductive layer interposer and a first die at least partially encapsulated in a mold material;
wherein the first die is mechanically and electrically attached to a top surface of the stacked conductive layer interposer using solder bumps; and
applying a first metal warpage correction layer to a top surface of the first die and the mold material.

10. The method of claim 9, wherein applying the first warpage correction layer comprises:
forming the first warpage correction layer on a top surface of the integrated circuit.

11. The method of claim 9, further comprising:
providing a second die at least partially encapsulated in the mold material and mechanically and electrically attached to the top surface of the stacked conductive layer interposer using solder bumps.

12. The method of claim 11, wherein applying the first warpage correction layer comprises:
forming the first warpage correction layer on a top surface of the integrated circuit;
wherein the top surface of the integrated circuit is formed of the first die, the second die, and the mold material.

13. The method of claim 9, further comprising:
applying a second warpage correction layer.

14. The method of claim 13, wherein applying the second warpage correction layer comprises forming the second warpage correction layer on a bottom of the stacked conductive layer interposer.

15. The integrated circuit of claim 1, wherein the first warpage correction layer consists essentially of a single layer of material.

16. The integrated circuit of claim 1, wherein the first warpage correction layer comprises one of gold, tungsten and titanium.

* * * * *